(12) United States Patent
Roth et al.

(10) Patent No.: US 12,272,401 B2
(45) Date of Patent: Apr. 8, 2025

(54) INEQUALITY CHECK WITH TERNARY CAM

(71) Applicant: HEWLETT PACKARD ENTERPRISE DEVELOPMENT LP, Spring, TX (US)

(72) Inventors: Ron M. Roth, Palo Alto, CA (US);
Luca Buonanno, Spring, TX (US);
Giacomo Pedretti, Cernusco sul Naviglio (IT); Catherine Graves, Milpitas, CA (US)

(73) Assignee: Hewlett Packard Enterprise Development LP, Spring, TX (US)

( * ) Notice: Subject to any disclaimer, the term of this patent is extended or adjusted under 35 U.S.C. 154(b) by 243 days.

(21) Appl. No.: 18/308,990

(22) Filed: Apr. 28, 2023

(65) Prior Publication Data

US 2024/0363163 A1 Oct. 31, 2024

(51) Int. Cl.
*G11C 15/04* (2006.01)
*G11C 13/00* (2006.01)

(52) U.S. Cl.
CPC ........ *G11C 15/046* (2013.01); *G11C 13/0069* (2013.01); *G11C 15/04* (2013.01)

(58) Field of Classification Search
CPC .................................................... G11C 15/046
See application file for complete search history.

(56) References Cited

U.S. PATENT DOCUMENTS 9,543,013 B1 * 1/2017 Govindaraj .......... G11C 15/046

* cited by examiner

*Primary Examiner* — Jason Lappas
(74) *Attorney, Agent, or Firm* — Dickinson Wright

(57) ABSTRACT

Systems and methods are provided for implementing a low power and area ternary content addressable memory (TCAM). An example of a TCAM comprises a match line, and a plurality of TCAM cells connected along the match line. Each TCAM cell stores a state of a threshold value. The TCAM cells are configured to pull down a signal over the match line in response to inequality between an input search and the threshold value. The plurality of TCAM cells comprises a number of TCAM cells that is less than the threshold value. The input values can be encoded according to a first encoding scheme and the threshold value can be encoded according to one of a second and a third encoding scheme based on an inequality check mapped to the plurality of TCAM cells.

20 Claims, 9 Drawing Sheets

| Input (X) Values | Encoding of Input (X) Values in N TCAM Inputs |||||||
|---|---|---|---|---|---|---|---|
| | $col_0$ | $col_1$ | $col_2$ | $col_3$ | $col_4$ | ... | $col_{N-2}$ | $col_{N-1}$ |
| 0 | 0 | 0 | X | X | X | | X | X |
| 1 | 1 | 0 | X | X | X | | X | X |
| 2 | 1 | X | 0 | X | X | | X | X |
| 3 | 1 | X | X | 0 | X | | X | X |
| ... | ... | | | | | | | |
| N-2 | 1 | X | X | X | X | | 0 | X |
| N-1 | 1 | X | X | X | X | | X | 0 |
| N | 1 | 1 | X | X | X | | X | X |
| N+1 | X | 1 | 1 | X | X | | X | X |
| N+2 | X | 1 | X | 1 | X | | X | X |
| N+3 | X | 1 | X | X | 1 | | 1 | X |
| ... | ... | ... | ... | ... | | ... | | ... |
| 2N-3 | X | 1 | X | X | X | | 1 | 1 |
| 2N-2 | X | 1 | X | X | X | | X | X |

| T Values | Encoding of T in N TCAM States ("≥") | | | | | | | |
|---|---|---|---|---|---|---|---|---|
| | $col_0$ | $col_1$ | $col_2$ | $col_3$ | $col_4$ | ... | $col_{N-2}$ | $col_{N-1}$ |
| 0 | X | X | X | X | X | ... | X | X |
| 1 | 1 | X | X | X | X | | X | X |
| 2 | 1 | 1 | X | X | X | | X | X |
| 3 | 1 | 1 | 1 | X | X | | X | X |
| ... | ... | | | | | | | |
| N-2 | 1 | 1 | 1 | 1 | 1 | ... | X | X |
| N-1 | 1 | 1 | 1 | 1 | 1 | | 1 | X |
| N | 1 | 1 | 1 | 1 | 1 | | 1 | 1 |
| N+1 | 0 | 1 | 0 | 0 | 1 | | 1 | 1 |
| N+2 | 0 | 1 | 0 | 0 | 1 | | 1 | 1 |
| N+3 | 0 | 1 | 0 | 0 | 1 | ... | 1 | 1 |
| ... | ... | | | | | | | |
| 2N-3 | 0 | 1 | 0 | 0 | 0 | | 1 | 1 |
| 2N-2 | 0 | 1 | 0 | 0 | 0 | | 0 | 1 |

| T Values | Encoding of T in N TCAM States ("≤") | | | | | | | |
|---|---|---|---|---|---|---|---|---|
| | col₀ | col₁ | col₂ | col₃ | col₄ | ... | col_{N-2} | col_{N-1} |
| 0 | 0 | 0 | 0 | 0 | 0 | | 0 | 0 |
| 1 | X | 0 | 1 | 1 | 1 | | 1 | 1 |
| 2 | X | 0 | 0 | 1 | 1 | | 1 | 1 |
| 3 | X | 0 | 0 | 0 | 1 | | 1 | 1 |
| ... | ... | | | | | | | |
| N-2 | X | 0 | 0 | 0 | 0 | | 0 | 1 |
| N-1 | X | 0 | 0 | 0 | 0 | | 0 | 0 |
| N | X | X | 0 | 0 | 0 | ... | 0 | 0 |
| N+1 | X | X | X | 0 | 0 | | 0 | 0 |
| N+2 | X | X | X | X | 0 | | 0 | 0 |
| N+3 | X | X | X | X | X | | 0 | 0 |
| ... | ... | ... | ... | | | | | |
| 2N-3 | X | X | X | X | X | | X | 0 |
| 2N-2 | 1 | X | X | X | X | | X | X |

INEQUALITY CHECK WITH TERNARY CAM

BACKGROUND

Content addressable memory (CAM) is a type of memory that may perform a search operation using an input data string as search content and outputting an address of a location in the memory that stores matching data (if any). Ternary content addressable memory (TCAM) is a type of content addressable memory that has bit cells that store a wildcard data value in addition to two binary values. When a bit cell that stores the wildcard data value is searched, the result may be a match regardless of what search criterion is used to search the bit cell. Some TCAMs may also allow a search to be conducted based on a wildcard search criterion. When a bit cell is searched based on the wildcard search criterion, the result may be a match regardless of what value is stored in the bit cell.

BRIEF DESCRIPTION OF THE DRAWINGS

The present disclosure, in accordance with one or more various implementations, is described in detail with reference to the following figures. The figures are provided for purposes of illustration only and merely depict typical or example implementations.

FIG. 4 illustrates an example first encoding scheme for an input feature vector in accordance with an example implementation of the present disclosure FIGS. 5 and 6 illustrate examples of a second encoding scheme and a third encoding scheme, respectively, for encoding TCAM cell states in accordance with an example implementation of the present disclosure.

Figure 1A:
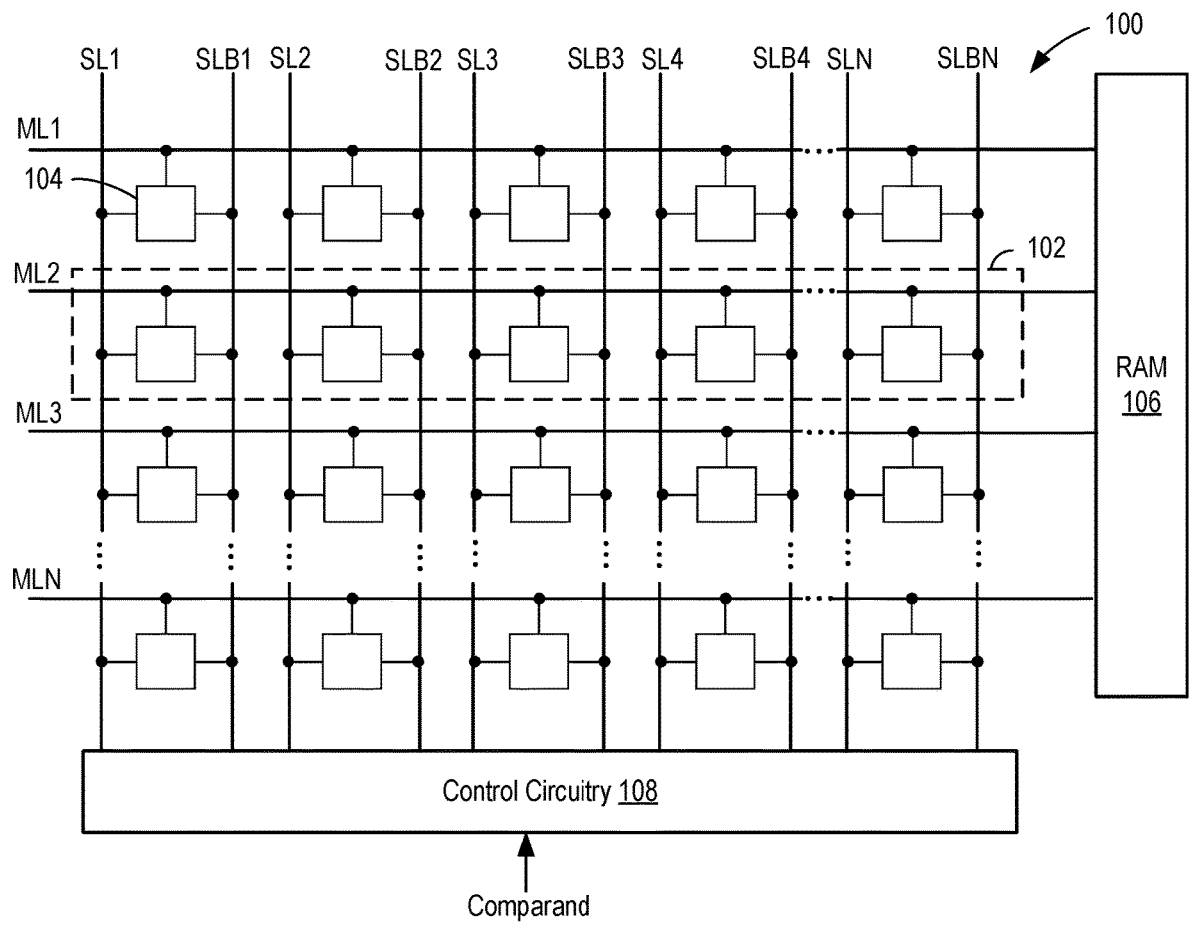
FIG. 1A illustrates an example ternary content addressable memory (TCAM) in which implementations of the technology disclosed herein can be implemented.

The figures are not exhaustive and do not limit the present disclosure to the precise form disclosed.

DETAILED DESCRIPTION

CAM is a hardware that compares an input pattern against stored binary data. The stored data of a CAM is not accessed by its location but rather by its content. A word, or "tag," is input to the CAM, the CAM searches for the tag in its contents and, when found, the CAM returns the address of the location where the found contents reside. CAMs are powerful, efficient, and fast. The input patterns and data in CAMs are represented by logic '0's and logic '1's (generally referred to as a binary CAM). Reading, writing, and comparing are the three main modes of operation for CAMs. Data stored in CAMs represents the memory address in random-access memory (RAM) where the underlying data sought is stored. If the data in RAM is to be accessed, the CAM is searched for the address associated with that desired data, with the memory address being retrieved from the CAM. In a binary CAM, an input search word is compared to a table of stored words through search lines and, if a match is found for the input search word in the stored CAM words, the CAM returns the address of the matching data to an encoder. If no match is found in any of the stored words, no match is indicated on the match lines and, in some cases, a flag may be triggered indicating the miss.

TCAMs store and search for a third (wildcard) value ('X'), allowing the match for both '0's and '1's. In this way, ternary content addressable memories (TCAMs) allow for additional complexity, as the search is allowed to search not only for direct matches to the binary inputs ('0's and '1's) but also allows the addition of so-called "don't care" bits, allowing for a bit to be either a logical '0' or logical '1' for a match. The in-memory parallel search nature of the TCAM enables real-time monitoring of the network traffic, and TCAMs are heavily used in networking for rapid network IP lookups and access control lists (ACLs). Large TCAMs are desirable, but a major challenge is that current TCAM implementations are power hungry and the extremely high throughput to keep up with network wirespeeds comes at the expense of high power consumption.

The present disclosure provides an encoding scheme that can be used to encode data and operate a TCAM for implementing an inequality check operation for decision tree-based machine learning (ML) models. Implementations disclosed herein provide for a TCAM comprising N TCAM cells that can be operated to compute inequalities between two integers in an interval of [0:2N−2], e.g., inequalities between a input search comparand and a threshold value providing an upper bound of the interval [0:2N−2]. According to an example implementation, input search comparand can be encoded using a first encoding scheme of the present disclosure and fed to the TCAM cells as a time-dependent array of voltage signals. The threshold values are stored in the TCAM cells as states of the TCAM cells using one of a second encoding scheme for "greater than or equal to" non-strict inequality checks and a third encoding scheme for "less than or equal to" non-strict inequality checks. Strict inequality checks can be converted to non-strict inequality checks by incrementing the threshold value depending on the operation (e.g., increment up where converting to a "greater than or equal to" non-strict inequality check from a "greater than" strict inequality check, or increment down where converting to a "less than or equal to" non-strict inequality check from a "less than" strict inequality check).

Each TCAM cell according to the present disclosure comprises a pair of memristors that can be programed to store one of three possible states (e.g., 0, 1, and wildcard). Through strategic programming of the two memristors, a collection of N TCAM cells can be programmed to each store one of the three possible states, which collectively define a threshold value according to a comparison or inequality to be computed. The programming of each TCAM cell can be based one of the second and third encoding scheme according to the inequality operation to be executed by the TCAM. For example, in the case of a "greater than or equal to" inequality check operation, states of the N TCAM cells may be programmed according to the second encoding scheme. Whereas, in the case of a "less than or equal to" inequality check operation, the states of the N TCAM cells may be programmed according to the third encoding scheme. The TCAM cells are then configured to drive a signal over a commonly connected match line based on the inequality check between an input search comparand and the threshold value as defined by the programming of the TCAM cells.

Implementations of the present disclosure can be used to reduce the number of TCAM cells for inequality check operations by a factor of approximately 2 compared to the number of TCAM cells required using a unary encoding. For example, as noted above, through the strategic programming, the number of TCAM cells required to compute an inequality is proportional to the threshold value of the inequality. Whereas, in the case of unary encoding, the number of TCAM cells require is significantly more. For example, to perform an inequality check on a threshold value of 3 or more using unary encoding (e.g., 0100 for a value of 3) with 4 bit precision would require 24 TCAM cells (or 16 TCAM cells). Whereas, implementations disclosed herein are capable of performing the calculation using 9 TCAM cells. Accordingly, due to the reduced number of TCAM cells required to perform such operations, overall TCAM footprint is reduced by a factor of approximately 2, power consumption is reduced proportional to the reduced number of TCAM cells, and computation speeds can be increased as few TCAM cells need be activated and executed.

FIG. 1A illustrates an example TCAM 100 in which implementations of the technology disclosed herein can be implemented. TCAM 100 comprises a plurality of TCAM cells 104, each TCAM cell 104 comprising both storage and comparison circuitry. Each TCAM cell 104 represents a bit of a stored data word. For example, the array 102 of bits—illustratively depicted as a horizontal row of bits—represents a single data word, used to represent one or more addresses within an associated random access memory (RAM) 106 or other storage media of a computing device including example TCAM 100. Each array 102 of bits represents a different stored data word of TCAM 100. Match lines ML1-MLN run horizontally between the data words, and indicate whether bits of a search word (e.g., comparand) matches the bits stored in the TCAM cells 104 of any one of the array data words. As such, each array 102 consists of a number of TCAM cells 104 connected along a common match line, which can be situated in a horizontal row (as shown in FIG. 1A), a vertical column, or any orientation desired. Each match line ML1-MLN can be coupled to inputs of an RAM 106 for referencing one or more addressed locations (or memory blocks) within the RAM 106. In various implementations, each TCAM cell 104 can be set or reset (e.g., programmed) to a state represented as either a logic '0,' a logic '1,' or (as a ternary CAM) a "don't care" bit (e.g., 'X').

While FIG. 1A is described with reference to the TCAM 100 connected to RAM 106, such a configuration is not intended to limit the scope of the present disclosure. That is, while FIG. 1A provides for TCAM 100 connected to RAM 106 via match lines ML1-MLN, a connected RAM is not required within the scope of this disclosure. The TCAMs disclosed herein may be used directly for processing, for example, according to outputs on the match lines ML1-MLN.

Figure 1B:
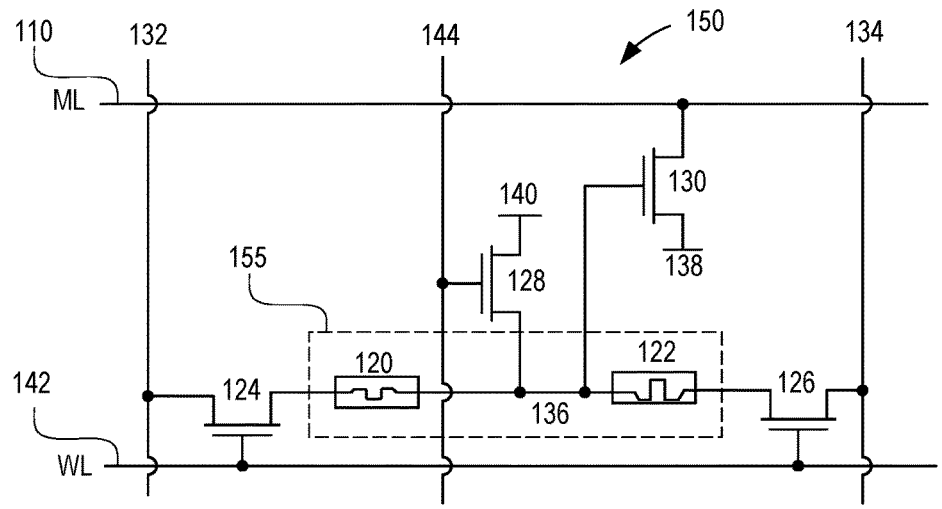
FIG. 1B illustrates an example four transistor, two memristor (4T2M) TCAM cell in accordance with an example implementation of the technology disclosed herein.

FIG. 1B illustrates an example four transistor, two memristor (4T2M) TCAM cell 150 in accordance with an example implementation of the technology disclosed herein. TCAM cell 150 is an example of a TCAM cell that can be implemented as the plurality of TCAM cells 104 discussed above with respect to FIG. 1A. While the present disclosure is described with reference to TCAM cell 150, it will be appreciated that other implementations of TCAM cells are possible within the scope of the present disclosure. For example, TCAM cell 104 can be implemented as a two transistor, two memristor (2T2M) TCAM cell, such as that described in U.S. Pat. No. 10,847,224, the disclosure of which is incorporated herein by reference in its entirety. As another example, TCAM cell 104 can be implemented, for example, as a conventional semiconductor memory (e.g., static random access memory (SRAM)) and comparison circuitry, which utilizes complementary metal-oxide semiconductor (CMOS) transistors to implement memristors. Accordingly, TCAM cell 104 can be implemented as any TCAM cell known in the art.

Referring now to FIG. 1B, the TCAM cell 150 may include memristors 120 and/or 122 as storage elements. The use of memristors 120, 122 as storage elements in the TCAM cell 150 may allow the TCAM 100 to be a non-volatile memory device. In addition, as a result of using memristors 120, 122, the TCAM 100 may have higher storage densities and lower power consumption than comparable TCAMs that use SRAMs or DRAMs as storage elements.

The TCAM cell 150 may include a first memristor 120, a second memristor 122, a first switching transistor 124, a second switching transistor 126, a third switching transistor 128, and a match line transistor 130. The first switching transistor 124, the first memristor 120, the second memristor 122, and the second switching transistor 126 may be connected in series between a first search line 132 (e.g., SL) and a second (or inverse) search line 134 (e.g., SLB). Thus, the first memristor 120 may be switchably connected to the first search line 132 via the first switching transistor 124, and the second memristor 122 may be switchably connected to the second search line 134 via the second switching transistor 126. The first memristor 120 and the second memristor 122 may be connected to each other via a common node, namely the node 136. The match line transistor 130 may be connected between a first rail 138 (e.g., ground) and the match line 110. The third switching transistor 128 may be connected between the node 136 and a second rail 140 (e.g., high voltage source). Thus, the node 136 may be switchably connected to the second rail 140 via the third switching transistor 128.

Gates of the first and second switching transistors 124 and 126 may be connected to a word line 142, and therefore a voltage of the word line 142 may control conductive states of the first and second switching transistors 124 and 126. Thus, a voltage on the word line 142 can operate to activate transistors 124 and 126 in order to enable search and permit a voltage on first search line 132 and second search line 134 to act on the memristors 120 and 122. A gate of the third switching transistor 128 may be connected to a service line 144, and a voltage on the service line 144 may control a conductive state of the third switching transistor 128 for programming the memristors 120 and 122. A gate of the match line transistor 130 may be connected to the node 136, and therefore a voltage of the node 136 may control a conductive state of the match line transistor 130.

The first and second memristors 120 and 122 may serve as the storage element of the TCAM cell 150 for storing a programmed state. A memristor (such as the first and second memristors 120 and 122) may be a device whose resistance may be changed between multiple resistance states by applying certain voltage differences across the memristor or flowing certain currents through the memristor, with the device "remembering" or maintaining its most recent resistance state even when the voltage/current that caused the device to enter that state has been removed. In other words, the current resistance state of a memristor may depend on the magnitude and polarity of voltage differences that have been applied across the memristor in the past or on how much current has flowed in what direction through the memristor in the past.

As an illustrative example, the memristors 120 and 122 may each change between a low resistance state (LRS) in which the memristor 120 and 122 exhibits relatively low resistance and a high resistance state (HRS) in which memristor 120 and 122 exhibits relatively high resistance. For each of the memristors 120 and 122, the respective memristor may be caused to enter the low resistance state by applying a setting voltage difference of sufficient magnitude across the memristor via service line 144 with a certain polarity, and the respective memristor may be caused to change to the high resistance state by applying a resetting voltage difference of sufficient magnitude across the memristor via service line 144 with an opposite polarity.

The polarities with which the programming voltage differences may be applied to the memristors 120 or 122 in order to perform setting and resetting as indicated in FIG. 1B by a black band on one end of the symbol for the memristor 120 or 122. In particular, in order to set the memristor 120 or 122 to the low resistance state, the setting voltage difference may be applied across the memristor 120 or 122 such that a lower voltage is applied to the end of the memristor 120 or 122 that has the black band than is applied to the other end of the memristor 120 or 122. Conversely, in order to reset the memristor 120 or 122 to the high resistance state, the resetting voltage difference may be applied across the memristor 120 or 122, such that a higher voltage may be applied to the end of the memristor 120 or 122 that has the black band.

Once the memristor 120 or 122 is programmed, the memristor 120 and 122 will tend to stay in its current resistance state until it is reset or set again. Moreover, the first and second memristors 120 and 122 in the TCAM cell 150 may be set or reset independently from one another. As a result, the combination of resistance states of the first and second memristors 120 and 122 may be used to store data values as states. For example, resistance states and stored values may be associated with one another according to Table 1. For instance, a first digital value (such as logic "0") may be stored by setting the first memristor 120 ($M_1$) to the low resistance state and setting or resetting the second memristor 122 ($M_2$) to the high resistance state. A don't care (or wildcard) value may be stored by causing the first and second memristors 120 and 122 to have the same resistance state as one another (e.g., either both of the memristors 120 and 122 have the high resistance state as shown in Table 1 or both have the low resistance state).

TABLE 1

Memristor Resistance Encoding of TCAM Cell States

| State | $M_1$ | $M_2$ |
| --- | --- | --- |
| 0 | LRS | HRS |
| 1 | HRS | LRS |
| X | HRS | HRS |

Accordingly, for instance, the TCAM cell 150 may store one of three values, including a wildcard value. That is, the TCAM cell 150 may be searched on the basis of the three search criteria including a wildcard search criterion. Thus, the TCAM cell 150 may provide greater flexibility and speed in search operations.

In an example operation, the TCAM 100 may include search drives in the control circuitry 108 that searches the TCAM 100 based on an input search comparand. The input search comparand may consist of input data values, each made represented as search criterion applied to a TCAM cell 150. The input search criterion may consist of one of a first input search criterion (e.g., input value "0"), a second search criterion (e.g., input value "1"), or a third or wildcard search criterion (e.g., input value "X"). An input data value can be encoded onto the first search line 132 and second search line 134 using the input search criterion according to Table 2 below. For example, the control circuitry 108 may search the TCAM cell 150 based on the first search criterion (e.g., input value "0") by pre-charging the match line 110, applying a ground voltage (e.g., logic low "0") to the first search line 132, and applying a first voltage (e.g., logic high "1") to the second search line 134. The control circuitry may search the TCAM cell 150 based on the second search criterion (e.g., input value "1") by pre-charging the match line 110, applying the first voltage to the first search line 132, and applying the ground voltage to the second search line 134. The control circuitry 108 may search the TCAM cell 150 based on the wildcard search criterion by applying a ground voltage to both the first and second search lines 132 and 134 (or by applying the first voltage to both the first and second search lines 132 and 134).

TABLE 2

Input value encoding

| Input | SL | SLB |
| --- | --- | --- |
| 0 | 0 | 1 |
| 1 | 1 | 0 |
| X | 0 | 0 |

The two memristors 120 and 122 of the TCAM cell 150 may form a resistive divider 155 at the common node 136. An output voltage ($V_G$) of the resistive divider 155 (e.g., the voltage of the common node 136 between the two memristors 120 and 122) may be applied to the gate of the match line transistor 130, and thus the output voltage of the resistive divider 155 may control whether the match line transistor 130 is on or off. The relative resistances of the two memristors 120 and 122 and the voltages that are applied to the TCAM cell 150 during a search operation may be set such that the output voltage of the resistive divider 155 during the search operation is an off-voltage (low voltage) when the memristors 120 and 122 store a value that matches the search criterion and an on-voltage (high voltage) when the memristors 120 and 122 store a value that do not match the search criterion (e.g., mismatch). When the search criterion is the wildcard search criterion, the output voltage of the resistive divider 155 is lower than the high voltage regardless of what value is stored in the memristors 120 and 122.

If a TCAM cell 150 stores a value that does not match the search criterion, the voltage of the common node 136 during the search may become a voltage that turns on the match line transistor 130, thereby directly connecting the match line 110 to the rail 138 and resulting in a voltage ($V_G$) on the match line 110 (which has been pre-charged) being pulled down below its pre-charged voltage. If the TCAM cell 150 stores a value matching the search criterion (or TCAM cell 150 stores a wildcard), then the voltage of the common node may become a voltage that keeps the match line transistor 130 off so that the voltage ($V_G$) of the match line 110 is not pulled down (at least not by that TCAM cell 150). Thus, when the TCAM cell 150 does not match the search criterion, the voltage of the match line 110 may be pulled down below a pre-charged voltage level. However, when the TCAM cell 150 matches the search criterion, the voltage of the match line 110 may remain at the pre-charged voltage level. Table 3 below shows an example of the above described operation.

TABLE 3

TCAM Cell Operation

| State | Search | VG | Output |
|---|---|---|---|
| 0 | 0 | 0 | Match |
| 0 | 1 | 1 | Mismatch |
| 0 | X | 0 | Match |
| 1 | 0 | 1 | Mismatch |
| 1 | 1 | 0 | Match |
| 1 | X | 0 | Match |
| X | 0 | 0.5 | Match |
| X | 1 | 0.5 | Match |
| X | X | 0 | Match |

In one regard, therefore, the TCAM cell 150 may drive the voltage of the match line 110 to either be at the pre-charged voltage level or at a voltage level that is lower than the pre-charged voltage level depending upon whether there is a match between an input search criterion of an input search comparand (e.g., the search word) and the TCAM state stored in the TCAM cell 150. As a result, the TCAM 100 may drive either a high voltage signal (if there is a match) or a low voltage signal (if there is a miss) on the match line.

Additional details regarding the example 4T2M TCAM cell described herein can be found, for example, in U.S. Pat. No. 10,418,103, the disclosure of which is incorporated herein by reference in its entirety.

Referring back to FIG. 1A, to perform a search operation, all of match lines ML1-MLN are pre-charged by placing the match lines temporarily in a match state. An input search comparand can be made up of a number of input data values, each of which is encoded according to Table 2 above. Once the match lines ML1-MLN are pre-charged, each search driver of control circuitry 108 drives respective input search criterion of a input data value onto respective first search line 132 (e.g., SL) and second search line 134 (e.g., SLB) of the respective column by encoding the input data values according to Table 2. Each TCAM cell 150 stores a state according to Table 1 and compares its stored state against the input data value encoded on its corresponding search lines 132, 134. TCAM cells 150 with matching data do not affect the corresponding match line ML1-MLN (e.g., matched TCAM cells 150 do not pull down the corresponding match line ML1-MLN from its pre-charged state). However, TCAM cells 150 encoded with a state that is mismatched to the respective input value encoded on the search lines 132, 134 pull down the corresponding match line ML1-MLN from its pre-charged state. TCAM cells 150 storing a wildcard (e.g., 'X' or don't care state) operate as if a match has occurred, therefor not pulling down the pre-charged state of the corresponding match line ML1-MLN. The aggregate result is that match lines ML1-MLN are pulled down for any comparand that has at least one mismatch, thereby indicating an overall mismatch to RAM 106. Where all of TCAM cells 150 match the input data values of the comparand, the corresponding match line ML1-MLN remains in the pre-charged state, indicating a match of the comparand to RAM 106. The match address output of TCAM 100 is used as a pointer, which is used to access associated data from the RAM 106 at the matched address location.

According to implementations disclosed herein, TCAM 100 can be utilized for direct computation of comparison operations and/or inequality evaluations between input data valued provided as search comparand to the TCAM 100 and stored states of the TCAM 100. These mathematical operations can be useful for exploring binary decision tree models that can be useful in implementing machine learning algorithms, such as decision tree learning. A decision tree model comprises a root (or base) node and a plurality of outcomes (or leaves) chained together through a number of decision nodes forming a root to leaf path. Inputs into the decision tree are evaluated at each decision node to output an outcome according to the root to leaf path.

In the case of a decision tree learning, a goal is to create a model that predicts an output of a target variable based on several input variables. To achieve this goal, a decision tree functions to classify input data into a class. The input data can be provided as a feature vector comprising a dataset of feature values in a discrete domain. The outcomes (or leaves) represent classification or "classes" that the feature vector can be tagged or labeled with based on traversing the decision tree. Each decision node defines comparison operations and/or inequality evaluations for evaluating one of the feature values, where each node is applied on a different feature value from the feature vector. Traversing the decision tree along a root to leaf path leads to a specific class, such that an feature vector input into the decision tree can be labeled with the specific class.

Figure 2A:
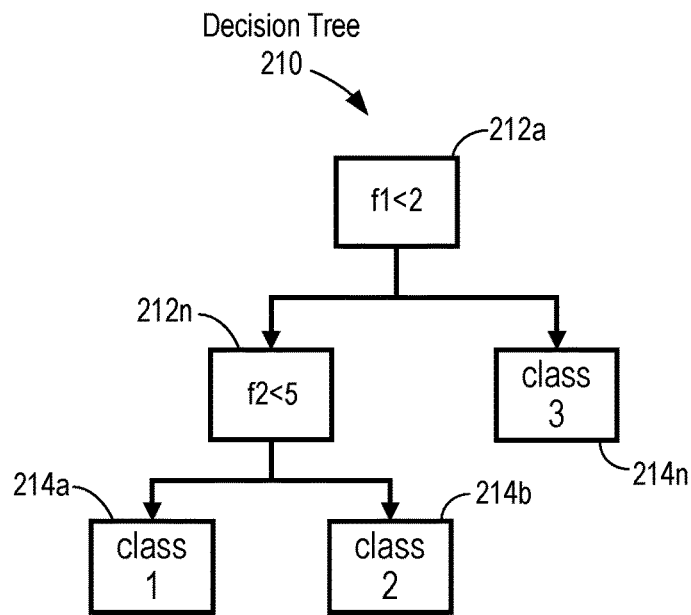
FIG. 2A shows an example decision tree model.

FIG. 2A shows an example decision tree model 210. Decision tree model 210 comprises decision nodes 212a-212n, which provide for root to leaf paths for labeling feature vectors according to one of leaf nodes 214a-214n. In the simplified example of decision tree model 210, two decision nodes 212a and 212n are provided for evaluating a feature vector comprising feature f1 and f2, which are provided as values (e.g., feature values). The decisions nodes 212a and 212n form a number of root to leaf paths for classifying feature vectors into one of classes 1-3 of leaf nodes 214a-214n. Each decision node 212a-212n defines conditions to be applied to a discrete feature of the feature vector for directing the traversal through decision tree model 210. That is, each decision node 212a-212n defines a respective threshold value that the individual features are evaluated against according to operators of the respective decision node. For example, node 212a evaluates feature f1 to determine if the value of f1 is less than a threshold value of 2. If so, the decision tree evaluates feature f2 at decision node 212n to determine if value of f2 is less than a threshold value of 5. If so, then the feature vector can be classified (e.g., labeled) as class 1. Alternatively, if feature value of f1 is greater than or equal to the threshold value 2 at decision node 212a, the feature vector is classified into class 3. And so on.

Decision tress can be reformulated (e.g., converted) into a node series representation for exploration using a CAM. In a node series representation, each root to leaf path is represented as a single chain with a series of nodes to for evaluating feature values, where each root to leaf path is a single linear series of nodes leading to one of the outcomes (e.g., classes). If multiple decision nodes of a decision tree apply different threshold values to an individual feature, these multiple threshold values can be combined into a single series node. Additionally, wildcard thresholds (or don't care markers) can be added along a series where a feature is not evaluated along the chain (e.g., outcome of the class is not dependent on the feature).

Figure 2B:
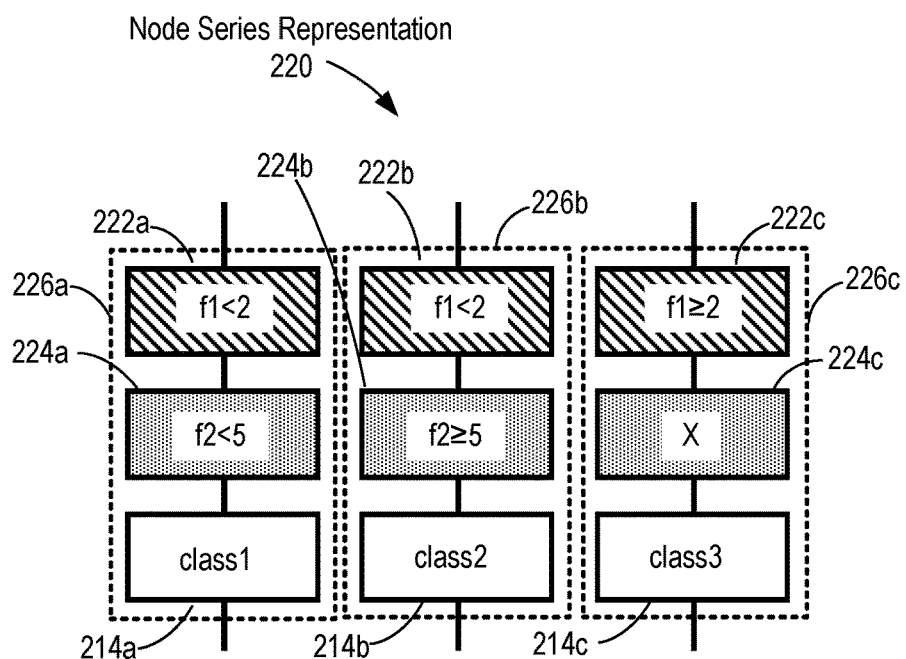
FIG. 2B illustrates a node series representation of the decision tree model of FIG. 2A.

FIG. 2B illustrates a node series representation 220 of decision tree model 210. As shown in FIG. 2B, node series representation 220 comprises three chains 226a-226c, each representing a root to leaf path the traverses decision tree model 210 to a respective outcome. Each decision node 212a-212n is decomposed into decisions and represented along each chain. For example, decision node 212a is represented as series nodes 222a-222c and decision node 212n is resented as series nodes 224a-224c. As noted above, a wildcard threshold is provided at series node 224c because the root to leaf path for classifying a feature vector as class 3 does not consider (e.g., does not care) what the value of feature f2 is, the feature vector is labeled as class 3 as long as the value of feature f1 is greater than or equal to the threshold value 2 at series node 222c.

To implement a decision tree using a CAM, such as TCAM 100 described above, the node series representation can be mapped to cells of a CAM. For example, each chain of series nodes can be mapped to an array of CAM cells. In various implementations, the node series representation can be rotated such that each chain of series nodes is mapped to a row in the CAM cell array. For example, referring to FIG. 1A, each chain 226a-226c can be mapped to an array 102 of TCAM cells 104 connected along a common match line, where each series node can be mapped to subset of individual TCAM cells 104. In another example, the TCAM 100 may be rotated such that the array 102 of TCAM cells is vertical or in any other orientation, so long as each TCAM cell 104 in the array 102 are connected along a common match line.

Figure 3:
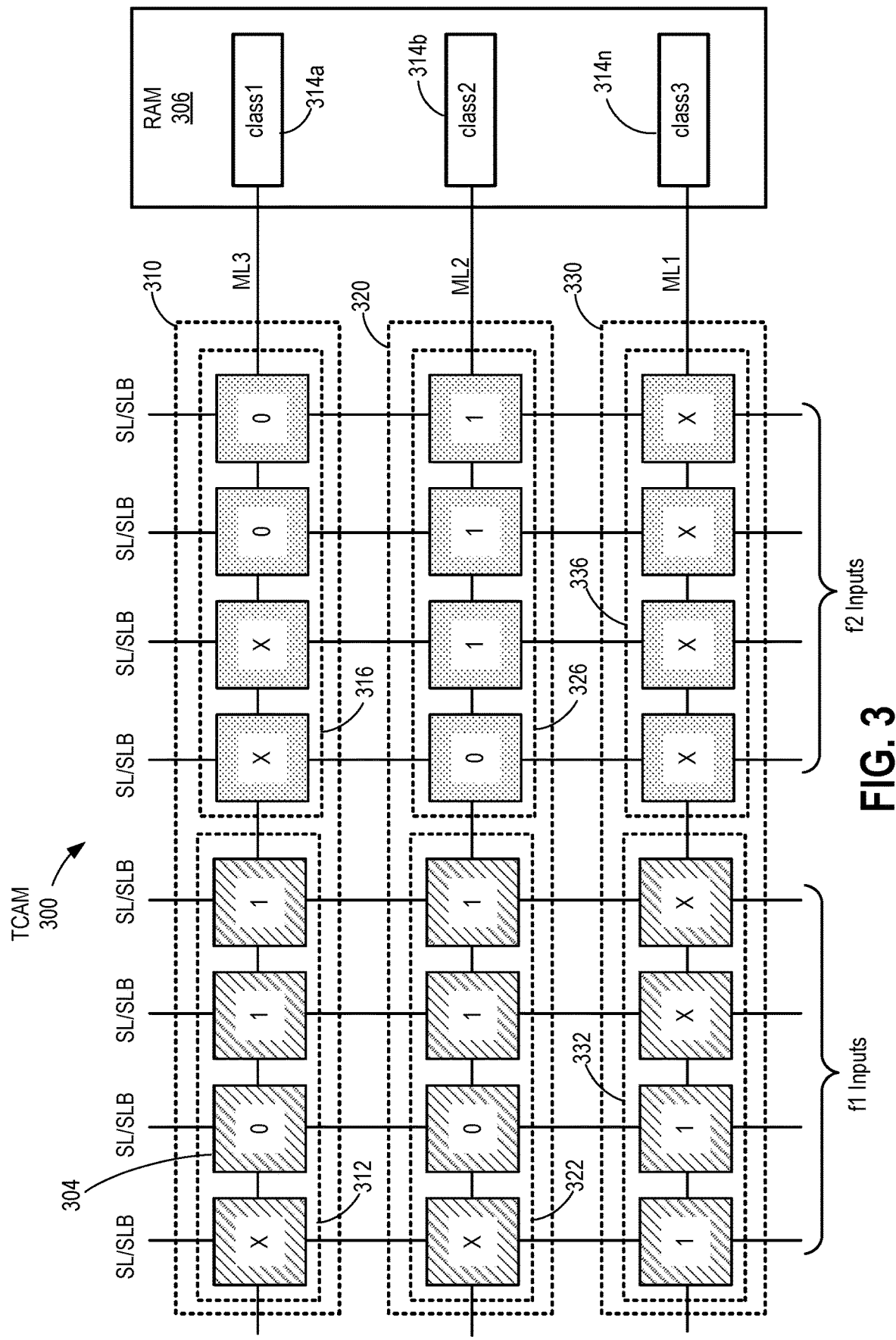
FIG. 3 shows an example TCAM that can be utilized for traversing a decision tree according to an input feature vector in accordance with an example implementation of the present disclosure.

FIG. 3 shows an example TCAM 300 that can be utilized for traversing a decision tree according to an input feature vector in accordance with an example implementation of the present disclosure. TCAM 300 comprises a plurality of TCAM cells 304, each TCAM cell 304 comprising both storage and comparison circuitry and being substantially similar to TCAM cell 104 described above in connection with FIG. 1A. The TCAM cells 304 are arranged in an array of TCAM cells 304, where a subset TCAM cells 304 are connected along a respectively common match line ML1-ML3. For example, as shown in FIG. 3, a first subset 310 of TCAM cells 304 are connected to ML1, a second subset 320 of TCAM cells 304 are connected to ML2, and a third subset 330 of TCAM cells 304 are connected to ML3. While FIG. 3 depicts each subset of TCAM cells 304 arranged in horizontal rows, implementations disclosed herein are not limited to horizontal row. Any orientation is possible, as long each subset of TCAM cells 304 is connected to a distinct match line. Furthermore, each search line SL/SLB, which is representative of a first search line 132 and second search line 134 combined, is connected to one TCAM cell 304 of each group of TCAM cells. Thus, an input search criterion, encoded according to Table 2, can be supplied to a TCAM cell of each group for performing a comparison with a stored state.

Each match line ML1-ML3 is coupled to inputs of RAM 306 for accessing one or more addressed locations within the RAM 306. RAM 306 may be substantially similar to RAM 106 described above in connection with FIG. 1A. RAM 306 stores each class 1-3, corresponding to nodes 214a-214n, at addressed locations (or blocks) 314a-314n within RAM 306. Based on evaluation of the decision tree as executed by TCAM 300, feature vectors matching states stored in the TCAM 300 can be labeled and stored within one of the blocks 314a-314n within RAM 306 according to a determined classification.

As described above, each TCAM cell 304 can be programmed with a state, according to Table 2 above, to represent either a logic state '0,' a logic state '1,' or a wildcard state (e.g., 'X'), which can be utilized for mapping decision nodes to TCAM cells. More particularly, as described above, each chain of a node series representation can be mapped to an individual subset of TCAM cells 304. For example, referring to node series representation 220, chain 226a for class 1 can be mapped to the first subset 310 of TCAM cells 304 connected to ML3, chain 226b for class 2 can be mapped to the second subset 320 of TCAM cells 304 connected to ML2, and chain 226c for class 3 can be mapped to the third subset 330 of TCAM cells 304 connected to ML1.

Each series node of node series representation 220 can then be mapped to a group of TCAM cells 304 of each subset of TCAM cells 304. For example, series node 222a can be mapped to a first group 312 of the first subset 310 of TCAM cells 304, and series node 224a can be mapped to a second group 316 of the first subset 310 of TCAM cells 304. Similarly, series nodes 222b and 224b can be mapped to first and second groups 322 and 326 of the second subset 320 of TCAM cells connected to ML2, and series nodes 222c and 224c can be mapped to first and second groups 332 and 336 of the third subset 330 of TCAM cells connected to ML1.

Mapping of the series nodes to the TCAM cells can be achieved through strategic programming of the TCAM cell states and encoding of feature vectors as an input search comparand. For example, the feature vector comprises features, which can be encoded onto search lines SL/SLB (e.g., first search line 132 and second search line 134 of FIG. 1B). Each feature value can be encoded using a first encoding scheme that represent the feature value as a number of search criterion. That is, for example, a given feature value can be broken down into a number of first input search criterion (e.g., input value "0"), second search criterion (e.g., input value "1"), and/or wildcard search criterion (e.g., input value "X"). Then each search criterion can be supplied to one of the SL/SLB lines of TCAM 300, where each search criterion is encoded onto the SL and SLB line according to Table 2.

FIG. 4 illustrates an example first encoding scheme 400 in accordance with an example implementation of the present disclosure. First encoding scheme 400 is provided as a table of input values (or feature values) and search criterion for encoding a given input value onto a column (or SL/SLB line). As noted above, each search criteria is encoded onto a respective SL and SLB line according to Table 2. In first encoding scheme 400, "N" represents the number of TCAM cells mapped to a series node. That is, in the case of example TCAM 300, each node series is mapped to a groups of four TCAM cells, such that N is four in this example. Thus, there are four TCAM inputs (e.g., SL/SLB columns) on which an input value can be encoded. Accordingly, in this example, a value of f1 or f2 can be used as input values to map search criterion for that value as inputs into the TCAM cells.

States of TCAM 300 can be programmed according to a second and a third encoding scheme. For example, each TCAM cell 304 can be programmed with one of three states according to one of the second encoding scheme and the third encoding scheme based on the series node represented by the TCAM cell.

Figure 5:
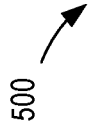

FIGS. 5 and 6 illustrate examples of second and third encoding schemes 500 and 600 in accordance with an example implementation of the present disclosure. Second and third encoding schemes are provided as tables of threshold values of a series node and states for encoding a given threshold value into a group of TCAM cells mapped to that series node. As noted above, each state (e.g., 0, 1, or wildcard) can be encoded into a TCAM cell according to Table 1. Similar to first encoding scheme 400 describe above, "N" represents the number of TCAM cells mapped to a series node. Accordingly, a threshold value of a series node can be mapped by second or third encoding scheme into states of the corresponding group of TCAM cells.

The use of second encoding scheme 500 or third encoding scheme 600 is dependent on the inequality check of a given series node. FIG. 5 illustrates an example of a second encoding scheme 500 that can be used to encode a series node executing a "greater than or equal to" (e.g., "≥") non-strict inequality checks. FIG. 6 illustrate an example of a third encoding scheme 600 that can be used to encode a series node executing "less than or equal to" operator (e.g., "≤") non-strict inequality checks. In either case, each group of TCAM cells 304 can be encoded using one of second encoding scheme 500 and third encoding scheme 600 depending on which series node, and operation executed thereby, that is mapped the group of TCAM cells. For example, if a series node defines a threshold value and a "greater than or equal to" comparison, then a group of TCAM cells mapped to that series node can be encoded using second encoding scheme 500. If a series node defines a threshold value and a "less than or equal to" comparison, then a group of TCAM cells mapped to that series node can be encoded using third encoding scheme 600.

The number of TCAM cells (N) of TCAM 300 can be based on the thresholds of inequality checks to be evaluated by TCAM 300. For example, TCAM 300 employs N TCAM cells 304 to compute inequalities having thresholds values in an interval of [0:2N−2]. That is, the threshold values of series nodes can be used to define the interval [0:2N−2], and the number N of TCAM cells 304 backed out from the interval. For example, consider the threshold values as q (e.g., the input and threshold values range from 0 to q−1), then the largest integer of the threshold values need not be greater than q/2. A number of N TCAM cells according to the disclosed implementations, can handle 2N−1 threshold levels, e.g., threshold values between 0 and 2N−2 (denoted as [0:2N−2]). A threshold level may correspond to an integer within the interval of threshold values. In the example of FIGS. 2A-3, the interval [0:6] corresponds 7 threshold levels, which translates to N=4 where 7=2N−1. Thus, using N TCAM cells, it is possible to compute comparisons and/or inequalities between two values in the interval [0:2N−2], which cuts the number of TCAM cells needed for computing inequalities by a factor of by a factor approximately 2 when compared to a naïve unary encoding.

FIG. 3 depicts encoded states for TCAM cells 304 when implemented to search decision tree model 210, as represented by node series representation 220. For example, decision tree model 210 has a highest threshold value of 5, thus N is set to four for mapping each series node of node series representation 220, as described above. Series nodes 222a and 222b provide for a condition of a strict "less than" inequality check on a threshold value of 2. A strict "less than" inequality for the integer domain (e.g., all values are provided as integers, as shown in this example) can be represented as a non-strict "less than or equal" inequality for one less the threshold value. Thus, series nodes 222a and 222b can be represented as "≤1". Since series nodes 222a and 222b are "less than or equal to", these nodes can be mapped to groups 312 and 322, respectively, and encoded with reference to third encoding scheme 600 for a T value of 1. Similarly, series node 224a can be mapped to group 316 using third encoding scheme 600 with a T value of 4, where N=4 in this example. Series nodes 222c and 224b can be mapped to groups 332 and 326, respectively, using second encoding scheme 500 and respective threshold values. Lastly, series node 224c can be mapped to group 336 and encoded as shown to represent a wildcard of series node 224c (e.g., that the answer should always be TRUE regardless of input value). An always true threshold value can be mapped using either the second encoding scheme or the third encoding scheme. In the case of the second encoding scheme, an always true threshold value can be represented as 0 as a T value and mapped as shown in FIG. 5, such that any input value will satisfy an. In the case of the third encoding scheme, an always true threshold value can be represented as 2N−2 as a T value and mapped as shown in FIG. 6.

By encoding states of TCAM 300 and input feature vector as described above, the TCAM 300 is able to drive a signal over the match lines responsive to inequalities between the input feature values and the TCAM cell states as defined by the programming of the TCAM cells. For example, an input comparand be encoded as described above, and control circuitry supply input search criterion for f1 and f2 onto respective columns. As described above, each match line ML1-ML3 is pre-charged and each match line ML1-ML3 will be pulled down if a mismatch occurs along the match line or remain unchanged if all search criterion match (or wildcard) TCAM cell states. As a result, where all of TCAM cells 150 match the input search criterion, the corresponding match line ML1-MLN remains in the pre-charged state, indicating a match of the comparand to RAM 106. The matched address output of TCAM 100 is used as a pointer to addressed locations (or blocks) 314a-314n within RAM 306 corresponding to the charged match line, which is used to label a input comparand (e.g., feature vector) with the corresponding class and store the input in association therewith.

Figure 7:
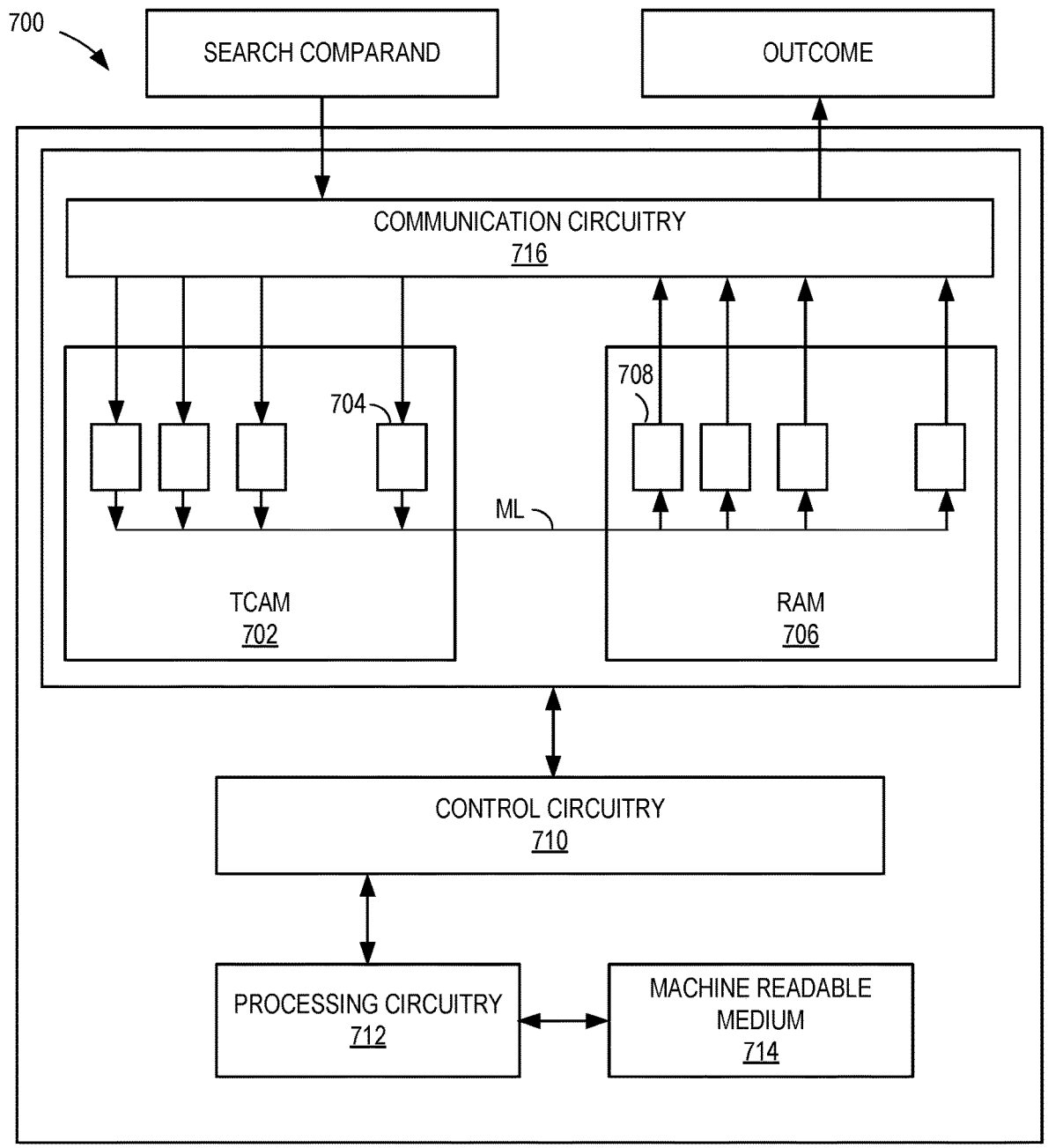
FIG. 7 shows a block diagram of an example apparatus that may include a TCAM, an RAM, and control circuitry to search the TCAM for a search comparand.

FIG. 7 is a block diagram of an example apparatus 700 that may include a TCAM 702, an RAM 706, and control circuitry 710 to search TCAM cells 704 for a search comparand. It should be understood that the apparatus 700 depicted in FIG. 7 may include additional components and that some of the components described herein may be removed and/or modified without departing from a scope of the apparatus 700 disclosed herein. The TCAM 100 may be an instance of the example TCAMs 100 and/or 300 described herein with reference to FIGS. 1A and 3, and may include an array of TCAM cells as described herein. The RAM 706 may be an instance of the example RAM 106 and/or 306 depicted in FIGS. 1A and 3 and may include an array of addressed locations (or blocks) 708 as example instance of addressed locations 314. Although a single TCAM 702 and a single RAM 706 are depicted in FIG. 7, the apparatus 700 may include multiple TCAMs 702 and multiple RAMs 706.

The apparatus 700 may be connected to a processor or may include a processor having an integrated processing circuitry 712 and control circuitry 710. The processor may be a semiconductor-based microprocessor, a central processing unit (CPU), an application specific integrated circuit (ASIC), a field-programmable gate array (FPGA), and/or another hardware device. It should be understood that the apparatus 700 may include multiple processors, multiple cores, or the like, without departing from a scope of the apparatus 700. The apparatus 700 may also include a non-transitory machine readable medium 714 that may have stored thereon machine-readable instructions executable by the processor.

The processing circuitry 712 may supply control signals to the control circuitry 710. The processing circuitry 712 may also supply the search comparand received via the communication circuitry 716 and the address to the control circuitry 710. The processing circuitry 712 may be any circuitry that may execute machine-readable instructions, such as a central processing unit (CPU), a microprocessor, a microcontroller device, a digital signal processor (DSP), etc. The processing circuitry 712 may also be an application-specific integrated circuit (ASIC), a field-programmable gate array (FPGA), an application-specific instruction set processor (ASIP), or the like, that is configured to perform certain operations described herein, such as the read, write, and search operations. The machine readable medium 714 may be any non-transitory machine readable medium, which may include volatile storage media (e.g., DRAM, SRAM, etc.) and/or non-volatile storage media (e.g., PROM, EPROM, EEPROM, NVRAM, hard drives, optical disks, etc.). The machine readable medium 714 may store machine-readable instructions that, when executed by the processing circuitry 712, may cause the apparatus 700 to perform some or all of the operations described herein, such as the search operations.

The communications circuitry 716 may be circuitry for receiving input data communications and sending output data communications such as a search comparand and an outcome search result from RAM 706, such as a classification of a search comparand into a class according to a search executed by TCAM 702. For example, the communications circuitry 716 may include a network interface card. In an example, the communications circuitry 716 may include multiple communications ports, and may serve to connect multiple other electronic devices to one another via the apparatus 700. For example, the apparatus 700 may be attached to or may be integrated into a network router for deep packet inspection. The architecture illustrated in FIG. 7 may operate at a high speed, with a outcome responsive to a search comparand being output in a single operation. In addition the layout of the apparatus 700 may be compact.

Figure 8:
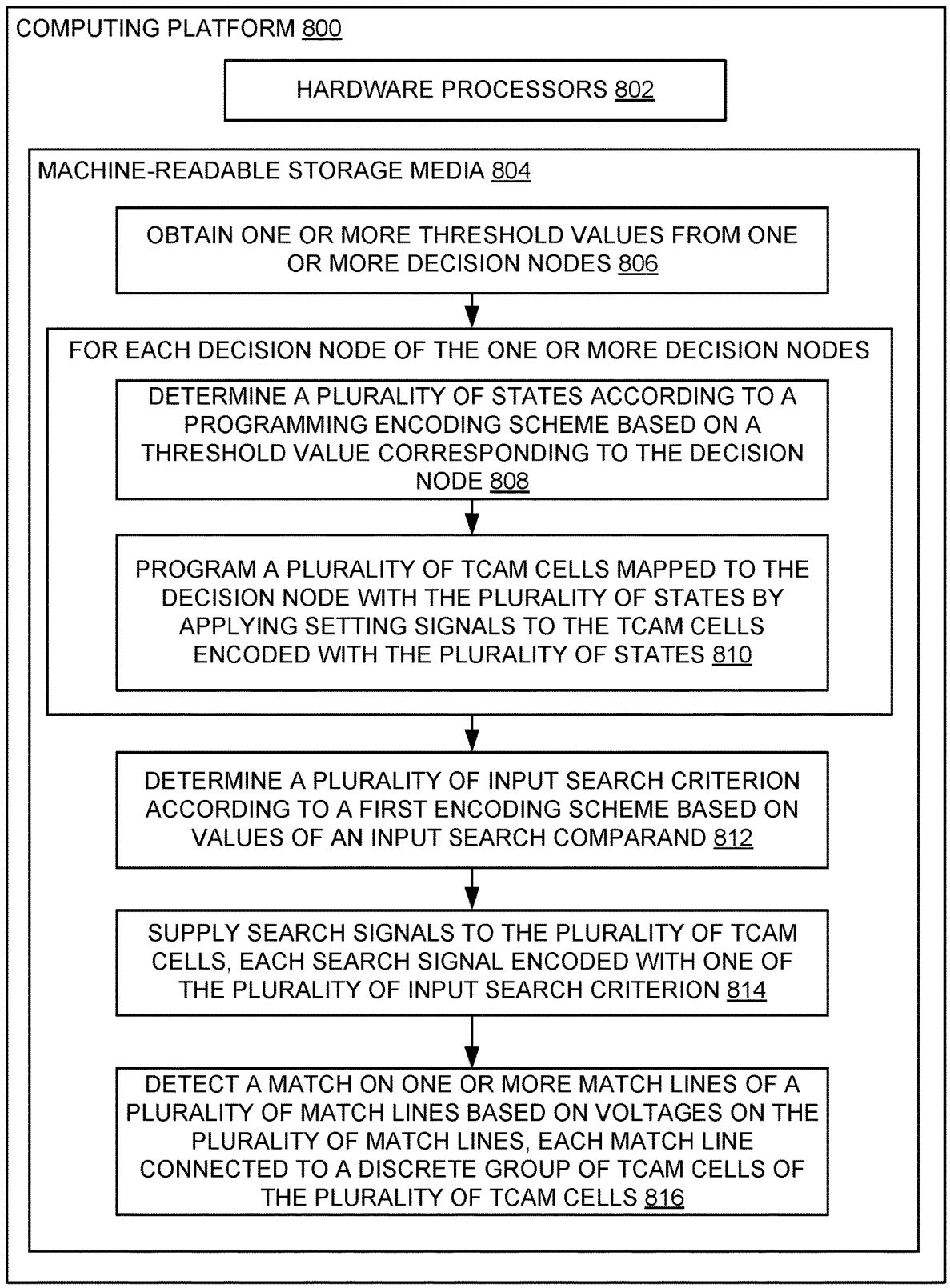
FIG. 8 is an example computing component that may be used to implement various features of performing inequality operations using a TCAM in accordance with the implementations disclosed herein.

FIG. 8 illustrates an example computing component that may be used to implement inequality operations using a TCAM in accordance with various implementations. Referring now to FIG. 8, computing component 800 may be, for example, a server computer, a controller, or any other similar computing component capable of processing data. In the example implementation of FIG. 8, the computing component 800 includes a hardware processor 802, and machine-readable storage medium for 804.

Hardware processor 802 may be one or more central processing units (CPUs), semiconductor-based microprocessors, and/or other hardware devices suitable for retrieval and execution of instructions stored in machine-readable storage medium 804. Hardware processor 802 may fetch, decode, and execute instructions, such as instructions 806-816, to control processes or operations for performing inequality operations. As an alternative or in addition to retrieving and executing instructions, hardware processor 802 may include one or more electronic circuits that include electronic components for performing the functionality of one or more instructions, such as a field programmable gate array (FPGA), application specific integrated circuit (ASIC), or other electronic circuits.

A machine-readable storage medium, such as machine-readable storage medium 804, may be any electronic, magnetic, optical, or other physical storage device that contains or stores executable instructions. Thus, machine-readable storage medium 804 may be, for example, Random Access Memory (RAM), non-volatile RAM (NVRAM), an Electrically Erasable Programmable Read-Only Memory (EEPROM), a storage device, an optical disc, and the like. In some implementations, machine-readable storage medium 804 may be a non-transitory storage medium, where the term "non-transitory" does not encompass transitory propagating signals. As described in detail below, machine-readable storage medium 804 may be encoded with executable instructions, for example, instructions 806-816.

Hardware processor 802 may execute instruction 806 to obtain one or more threshold values from one or more decision nodes. For example, as described above in connection with FIGS. 2A-2B, a decision tree may comprise decision nodes, each of which has a threshold value and comparison or inequality check operation to be computed.

For each decision node of the one or more decision nodes, hardware processor 802 may execute instruction 808 to determine a plurality of states according to a programming encoding scheme based on a threshold value corresponding to the decision node. For example, depending on the comparison or inequality defined by the decision node, one of a second or third encoding scheme (e.g., FIGS. 5 and 6) can be selected and the states can be determined from the selected encoding scheme.

Also, for each decision node of the one or more decision nodes, hardware processor 802 may execute instruction 810 to program a plurality of TCAM cells mapped to the decision node with the plurality of states by applying setting signals to the TCAM cells encoded with the plurality of states. For example, programming of the TCAM cells can be performed as described above in connection with FIGS. 1A and 1B according to the states determined from the encoding scheme selected for the mapped TCAM cells.

Hardware processor 802 may execute instruction 812 to determine a plurality of input search criterion according to a first encoding scheme based on values of an input search comparand. For example, as described above, an input search comparand can be encoded according to a first encoding scheme (e.g., FIG. 4), which defines input search criterion (e.g., 1, X, 0) that can be supplied to the TCAM cells.

Hardware processor 802 may execute instruction 814 to supply search signals to the plurality of TCAM cells, each search signal encoded with one of the plurality of input search criterion. For example, search signals can be supplied to search lines as described above in connection with FIGS. 1A and 1B and 3.

Hardware processor 802 may execute instruction 816 to detect a match on one or more match lines of a plurality of match lines based on voltages on the plurality of match lines, each match line connected to a discrete group of TCAM cells of the plurality of TCAM cells. An example of the detection of a match on match lines is described above in connection with FIGS. 1A-1B and 3.

Figure 9:
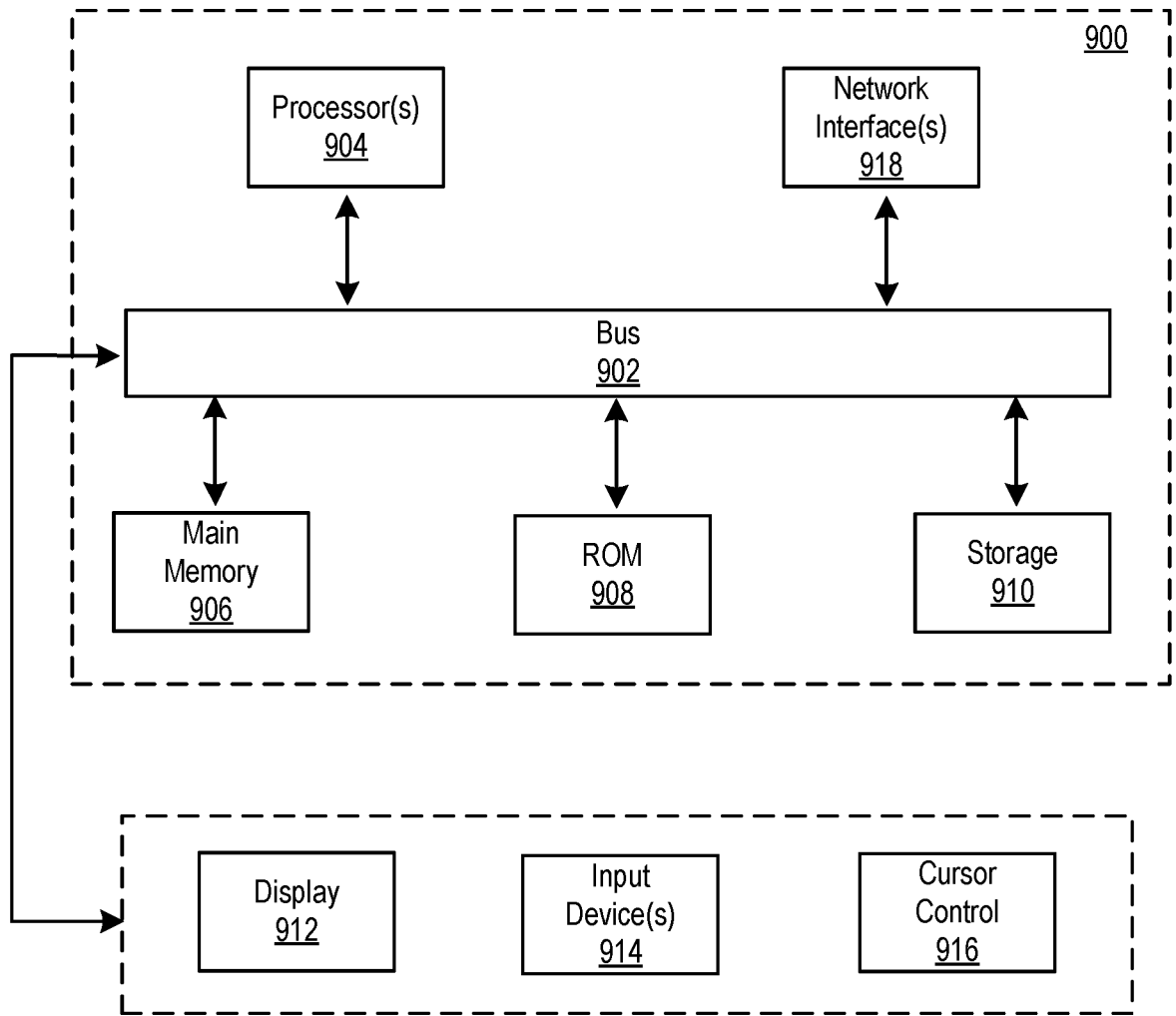
FIG. 9 is an example computer system that may be used to implement various features of performing inequality operations using a TCAM of the present disclosure.

FIG. 9 depicts a block diagram of an example computer system 900 in which various of the implementations described herein may be implemented. The computer system 900 includes a bus 902 or other communication mechanism for communicating information, one or more hardware processors 904 coupled with bus 902 for processing information. Hardware processor(s) 904 may be, for example, one or more general purpose microprocessors.

The computer system 900 also includes a main memory 906, such as a random access memory (RAM), cache and/or other dynamic storage devices, coupled to bus 902 for storing information and instructions to be executed by processor 904. Main memory 906 also may be used for storing temporary variables or other intermediate information during execution of instructions to be executed by processor 904. Such instructions, when stored in storage media accessible to processor 904, render computer system 900 into a special-purpose machine that is customized to perform the operations specified in the instructions.

The computer system 900 further includes a read only memory (ROM) 908 or other static storage device coupled to bus 902 for storing static information and instructions for processor 904. A storage device 910, such as a magnetic disk, optical disk, or USB thumb drive (Flash drive), etc., is provided and coupled to bus 902 for storing information and instructions.

The computer system 900 may be coupled via bus 902 to a display 912, such as a liquid crystal display (LCD) (or touch screen), for displaying information to a computer user. An input device 914, including alphanumeric and other keys, is coupled to bus 902 for communicating information and command selections to processor 904. Another type of user input device is cursor control 916, such as a mouse, a trackball, or cursor direction keys for communicating direction information and command selections to processor 904 and for controlling cursor movement on display 912. In some implementations, the same direction information and command selections as cursor control may be implemented via receiving touches on a touch screen without a cursor.

The computing system 900 may include a user interface module to implement a GUI that may be stored in a mass storage device as executable software codes that are executed by the computing device(s). This and other modules may include, by way of example, components, such as software components, object-oriented software components, class components and task components, processes, functions, attributes, procedures, subroutines, segments of program code, drivers, firmware, microcode, circuitry, data, databases, data structures, tables, arrays, and variables.

In general, the word "component," "engine," "system," "database," data store," and the like, as used herein, can refer to logic embodied in hardware or firmware, or to a collection of software instructions, possibly having entry and exit points, written in a programming language, such as, for example, Java, C or C++. A software component may be compiled and linked into an executable program, installed in a dynamic link library, or may be written in an interpreted programming language such as, for example, BASIC, Perl, or Python. It will be appreciated that software components may be callable from other components or from themselves, and/or may be invoked in response to detected events or interrupts. Software components configured for execution on computing devices may be provided on a computer readable medium, such as a compact disc, digital video disc, flash drive, magnetic disc, or any other tangible medium, or as a digital download (and may be originally stored in a compressed or installable format that requires installation, decompression or decryption prior to execution). Such software code may be stored, partially or fully, on a memory device of the executing computing device, for execution by the computing device. Software instructions may be embedded in firmware, such as an EPROM. It will be further appreciated that hardware components may be comprised of connected logic units, such as gates and flip-flops, and/or may be comprised of programmable units, such as programmable gate arrays or processors.

The computer system 900 may implement the techniques described herein using customized hard-wired logic, one or more ASICs or FPGAs, firmware and/or program logic which in combination with the computer system causes or programs computer system 900 to be a special-purpose machine. According to one implementation, the techniques herein are performed by computer system 900 in response to processor(s) 904 executing one or more sequences of one or more instructions contained in main memory 906. Such instructions may be read into main memory 906 from another storage medium, such as storage device 910. Execution of the sequences of instructions contained in main memory 906 causes processor(s) 904 to perform the process steps described herein. In alternative implementations, hard-wired circuitry may be used in place of or in combination with software instructions.

The term "non-transitory media," and similar terms, as used herein refers to any media that store data and/or instructions that cause a machine to operate in a specific fashion. Such non-transitory media may comprise non-volatile media and/or volatile media. Non-volatile media includes, for example, optical or magnetic disks, such as storage device 910. Volatile media includes dynamic memory, such as main memory 906. Common forms of non-transitory media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM, NVRAM, any other memory chip or cartridge, and networked versions of the same.

Non-transitory media is distinct from but may be used in conjunction with transmission media. Transmission media participates in transferring information between non-transitory media. For example, transmission media includes coaxial cables, copper wire and fiber optics, including the wires that comprise bus 902. Transmission media can also take the form of acoustic or light waves, such as those generated during radio-wave and infra-red data communications.

The computer system 900 also includes a communication interface 918 coupled to bus 902. Network interface 918 provides a two-way data communication coupling to one or more network links that are connected to one or more local networks. For example, communication interface 918 may be an integrated services digital network (ISDN) card, cable modem, satellite modem, or a modem to provide a data communication connection to a corresponding type of telephone line. As another example, network interface 918 may be a local area network (LAN) card to provide a data communication connection to a compatible LAN (or WAN component to communicated with a WAN). Wireless links may also be implemented. In any such implementation, network interface 918 sends and receives electrical, electromagnetic or optical signals that carry digital data streams representing various types of information.

A network link typically provides data communication through one or more networks to other data devices. For example, a network link may provide a connection through local network to a host computer or to data equipment operated by an Internet Service Provider (ISP). The ISP in turn provides data communication services through the world wide packet data communication network now commonly referred to as the "Internet." Local network and Internet both use electrical, electromagnetic or optical signals that carry digital data streams. The signals through the various networks and the signals on network link and through communication interface 918, which carry the digital data to and from computer system 900, are example forms of transmission media.

The computer system 900 can send messages and receive data, including program code, through the network(s), network link and communication interface 918. In the Internet example, a server might transmit a requested code for an application program through the Internet, the ISP, the local network and the communication interface 918.

The received code may be executed by processor 904 as it is received, and/or stored in storage device 910, or other non-volatile storage for later execution.

Each of the processes, methods, and algorithms described in the preceding sections may be embodied in, and fully or partially automated by, code components executed by one or more computer systems or computer processors comprising computer hardware. The one or more computer systems or computer processors may also operate to support performance of the relevant operations in a "cloud computing" environment or as a "software as a service" (SaaS). The processes and algorithms may be implemented partially or wholly in application-specific circuitry. The various features and processes described above may be used independently of one another, or may be combined in various ways. Different combinations and sub-combinations are intended to fall within the scope of this disclosure, and certain method or process blocks may be omitted in some implementations. The methods and processes described herein are also not limited to any particular sequence, and the blocks or states relating thereto can be performed in other sequences that are appropriate, or may be performed in parallel, or in some other manner. Blocks or states may be added to or removed from the disclosed example implementations. The performance of certain of the operations or processes may be distributed among computer systems or computers processors, not only residing within a single machine, but deployed across a number of machines.

As used herein, a circuit might be implemented utilizing any form of hardware, software, or a combination thereof. For example, one or more processors, controllers, ASICs, PLAS, PALS, CPLDs, FPGAs, logical components, software routines or other mechanisms might be implemented to make up a circuit. In implementation, the various circuits described herein might be implemented as discrete circuits or the functions and features described can be shared in part or in total among one or more circuits. Even though various features or elements of functionality may be individually described or claimed as separate circuits, these features and functionality can be shared among one or more common circuits, and such description shall not require or imply that separate circuits are required to implement such features or functionality. Where a circuit is implemented in whole or in part using software, such software can be implemented to operate with a computing or processing system capable of carrying out the functionality described with respect thereto, such as computer system 900.

As used herein, the term "or" may be construed in either an inclusive or exclusive sense. Moreover, the description of resources, operations, or structures in the singular shall not be read to exclude the plural. Conditional language, such as, among others, "can," "could," "might," or "may," unless specifically stated otherwise, or otherwise understood within the context as used, is generally intended to convey that certain implementations include, while other implementations do not include, certain features, elements and/or steps.

Terms and phrases used in this document, and variations thereof, unless otherwise expressly stated, should be construed as open ended as opposed to limiting. Adjectives such as "conventional," "traditional," "normal," "standard," "known," and terms of similar meaning should not be construed as limiting the item described to a given time period or to an item available as of a given time, but instead should be read to encompass conventional, traditional, normal, or standard technologies that may be available or known now or at any time in the future. The presence of broadening words and phrases such as "one or more," "at least," "but not limited to" or other like phrases in some instances shall not be read to mean that the narrower case is intended or required in instances where such broadening phrases may be absent.

What is claimed is:

1. A ternary content addressable memory (TCAM) comprising:
   a match line; and
   a plurality of TCAM cells connected along the match line, wherein each TCAM cell stores a state of a threshold value, and wherein the TCAM cells are configured to pull down a signal over the match line in response to inequality between an input search and the threshold value,
   wherein the plurality of TCAM cells comprises a number of TCAM cells that is less than the threshold value.

2. The TCAM of claim 1, wherein the threshold value is included in a range of threshold values and the number of TCAM cells is based on the range of threshold values.

3. The TCAM of claim 2, wherein the number of TCAM cells is N and a size of the range of threshold values is 2N−1.

4. The TCAM of claim 1, wherein the plurality of TCAM cells comprises a first subset of TCAM cells and a second subset of TCAM cells, wherein each TCAM cell of the first subset of TCAM cells stores a state of a first threshold value, and each TCAM cell of the second subset of TCAM cells stores a state of a second threshold value.

5. The TCAM of claim 1, further comprising:
   a plurality of search line pairs connected to the plurality of TCAM cells, wherein the input search is encoded according to a first encoding scheme and supplied on the plurality of search line pairs.

6. The TCAM of claim 5, wherein the first encoding scheme is based on the number of TCAM cells.

7. The TCAM of claim 1, wherein the states stored in the plurality of TCAM cells are encoded according to one of a second encoding scheme and a third encoding scheme based on an inequality check mapped to the plurality of TCAM cells.

8. The TCAM of claim 7, wherein the second encoding scheme corresponds to greater than or equal to inequality checks and is based on the number of TCAM cells.

9. The TCAM of claim 7, wherein the third encoding scheme corresponds to less than or equal to inequality checks and is based on the number of TCAM cells.

10. The TCAM of claim 1, wherein each TCAM cell of the plurality of TCAM cells comprises a pair of memristors configured to store resistance states that together encode a state into the respective TCAM cell.

11. A method for performing inequality operations, the method comprising:
obtaining one or more threshold values from one or more decision nodes;
for each decision node of the one or more decision nodes,
determining a plurality of states according to a programming encoding scheme based on a threshold value corresponding to the decision node, and
programming a plurality of ternary content addressable memory (TCAM) cells mapped to the decision node with the plurality of states by applying setting signals to the TCAM cells encoded with the plurality of states;
determining a plurality of input search criterion according to a first encoding scheme based on values of an input search comparand;
supplying search signals to the plurality of TCAM cells, each search signal encoded with one of the plurality of input search criterion; and
detecting a match on one or more match lines of a plurality of match lines based on voltages on the plurality of match lines, each match line connected to a discrete group of TCAM cells of the plurality of TCAM cells.

12. The method of claim 11, wherein each discrete group of TCAM cells is based on a range of threshold values of the one or more threshold values.

13. The method of claim 12, wherein the number of TCAM cells is N, and a size of the range of threshold values is 2N−1.

14. The method of claim 11, wherein the plurality of TCAM cells are connected to a plurality of search line pairs, and wherein supplying search signals to the plurality of TCAM cells comprises supplying one of the plurality of input search criterion on each of the search line pairs.

15. The method of claim 11, wherein programming the plurality of TCAM cells comprises setting resistive states on pairs of memristors of the TCAM cells based on the plurality of states applying a setting voltage difference across each memristor.

16. The method of claim 11, wherein the first encoding scheme is based on a number of TCAM cells of each discrete group of TCAM cells.

17. The method of claim 11, wherein the programming encoding scheme comprises a second encoding scheme and a third encoding scheme, wherein the method further comprises:
for each decision node of the one or more decision nodes, selecting one of the second encoding scheme and the third encoding scheme based on an inequality check mapped to the plurality of TCAM cells,
wherein the plurality of states are determined according to the selected one of the second encoding scheme and the third encoding scheme.

18. The method of claim 17, wherein the second encoding scheme corresponds to greater than or equal to inequality checks and is based on a number of TCAM cells of each discrete group of TCAM cells, and wherein the third encoding scheme corresponds to less than or equal to inequality checks and is based on the number of TCAM cells of each discrete group of TCAM cells.

19. An apparatus, comprising:
a ternary content addressable memory (TCAM) including:
a plurality of match lines,
a plurality of search lines,
a plurality of subsets of TCAM cells storing a plurality of states defining one or more threshold values, each subset of TCAM cells is connected along an individual match line of the plurality of match lines and comprises one or more groups of TCAM cells storing states that collectively define a threshold value of the one or more threshold values, wherein each search line of the plurality of search lines is connected to a TCAM cell of each subset of TCAM cells, and
wherein each group of TCAM cells comprises a number of TCAM cells that is less than a largest threshold value of the one or more threshold values;
control circuitry configured to supply an input search comparand encoded onto the plurality of search lines; and
a random-access memory (RAM) connected to the plurality of match lines and comprising a plurality of addressed locations of memory, each addressed location associated with a match line of the plurality of match lines,
wherein the TCAM is configured to access an addressed location of the plurality of addressed locations stored the RAM based the one or more groups of TCAM pulling down a signal over a respectively connected match line in response to inequality between the input search comparand and a respective threshold value.

20. The apparatus of claim 19, wherein the input search supplied on the plurality of search lines is encoded according to a first encoding scheme, and wherein the states stored in the TCAM cells are encoded according to one of a second encoding scheme and a third encoding scheme based on an inequality check mapped to the plurality of TCAM cells.

* * * * *